United States Patent
Liao

(10) Patent No.: US 7,325,214 B2
(45) Date of Patent: Jan. 29, 2008

(54) METHOD FOR REALIZING CIRCUIT LAYOUT USING CELL LIBRARY

(75) Inventor: Tsuoe-Hsiang Liao, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 46 days.

(21) Appl. No.: 10/906,101

(22) Filed: Feb. 3, 2005

(65) Prior Publication Data

US 2006/0190887 A1 Aug. 24, 2006

(51) Int. Cl.
*G06F 17/50* (2006.01)
(52) U.S. Cl. .......................................... 716/11; 716/12
(58) Field of Classification Search .................... 716/1, 716/11, 12, 14
See application file for complete search history.

(56) References Cited

U.S. PATENT DOCUMENTS

| | | | | |
|---|---|---|---|---|
| 4,623,911 A | * | 11/1986 | Pryor | .......................... 257/202 |
| 6,477,696 B2 | | 11/2002 | Tien | |
| 6,536,028 B1 | * | 3/2003 | Katsioulas et al. | ........... 716/17 |

* cited by examiner

*Primary Examiner*—Thuan Do
(74) *Attorney, Agent, or Firm*—Winston Hsu

(57) ABSTRACT

A method for realizing circuit layouts. Complex integrated circuit includes cells of basic functions, and layout designs for these cells can be recorded as a library. The claimed invention replaces common power strips with grid power contacts/vias in the layout of each cell. While realizing the layout of an integrated circuit, a routing procedure is used to connect power of all cells arranged in the integrated circuit. Because power strips are avoided in each cell, the claimed invention can reduce layout height of each cell, and therefore increase integration of integrated circuits.

12 Claims, 3 Drawing Sheets

METHOD FOR REALIZING CIRCUIT LAYOUT USING CELL LIBRARY

BACKGROUND OF INVENTION

1. Field of the Invention

The present invention relates to a method for realizing circuit layouts. More particularly, to a method that avoids using power strips in order to reduce layout height of each cell, and therefore increase integration of integrated circuits.

2. Description of the Prior Art

Semiconductor integrated circuits are one of the most important hardware bases in the modern information society. A key design point of the semiconductor industry is to increase integration of integrated circuits, and therefore to use the area of integrated circuits more efficiently.

Generally speaking, integrated circuits having complex functions are made up of many circuit cells, each with basic functions. For example, cells of different kinds of logic gates, such as AND gates, OR gates, and invertors, cells of flip-flops, adders, and counters are always used to realize complex integral functions of digital integrated circuits. When designing an integrated circuit having specific functions, basic circuit cells that can realize the specific functions of the integrated circuit must be selected first. Next, with the basic cells already having been selected, designers draw out a layout design of the integrated circuit. Eventually, real semiconductor integrated circuits are manufactured according to the layout design. As a person skilled in the art is familiar with, a semiconductor circuit is made up of many semiconductor layers with different characteristics. By designing different layouts on different semiconductor layers, connections between transistors are realized, and therefore each cell and the whole integrated circuit are formed.

For the convenience of integrated circuit design, designers always establish a library including frequently used cells and their corresponding layout designs. When designing an integrated circuit, designers determine which cells are going to be used, then arrange corresponding layout designs of these cells selected from the library to determine a layout design of the integrated circuit as a whole. Real integrated circuits can then be manufactured according to the layout design of the integrated circuit.

FIG. 1 is a diagram illustrating how layout designs of cells in a library are used in a conventional manner to realize an integrated circuit. In the conventional manner, a library 10 includes layout designs of a plurality of cells P(1), P(2), ..., P(m), ..., P(M). In the layout design of each cell, there are active region layout(s) df, such as layout location of doping well(s) and diffusion region(s), polycrystalline silicon layout(s) pi, first metal layer layout mt1, and contact layout(s) ct, etc. With different active regions and polycrystalline silicon layouts, basic semiconductor structures, such as the source, drain, and gate of a MOS, of transistors are formed. Each metal layer connects different transistors; contact layouts connect layouts of different layers. Some contact/via layouts, on the other hand, form signal input/output ends of each cell, i.e. they are signal layouts of each cell. The layout designs of different semiconductor layers constitute transistors of each cell, and the basic function of each cell is then realized.

Please note that in the prior art, each cell comprises power strips formed by metal layer layouts, for example, the above-mentioned first metal layer layout. As a person skilled in the art is familiar with, transistors of each cell must connect to appropriate DC power, such as a DC supply voltage VDD or ground voltage (for example Vss). In the prior art scheme, for connecting each cell to DC power, traverse power strip layouts pw1 and pw2 are set in each cell. Basically, as is shown in FIG. 1, two power strip layouts are set on two opposite ends of each cell, and the power strip layouts cross each cell, connecting two different sides of each cell. With the cells being arranged adjacently, power layouts of each cell are interconnected. Hence, all the cells can receive required DC power.

Please now consider an example. When designing an integrated circuit 12, if it is required that the integrated circuit 12 includes a cell P(m) and a cell P(M), designers can find the layout designs of the cells P(m) and P(M) from the library 10, arrange the layout designs in the layout of the integrated circuit 12, and connect power strips of the cells P(m) and P(M). Next, a routing procedure is performed to connect input/output signal conducts/vias of each cell. The function of the whole integrated circuit is then realized through the interconnected cells. For example, in FIG. 1, the routing procedure includes realizing a routing layout rt0 on the first metal layer to connect certain contacts of the cell P(m) with certain contacts of the cell P(M). Signal layouts of the two cells are then interconnected, signals can pass between the two cells, and the two cells can act as a whole to realize the functions of the integrate circuit 12. After the routing layout is realized, the routing procedure comes to an end, and layout design of the whole integrated circuit 12 is also finished. A semiconductor manufacturing process is then performed to produce real semiconductor integrated circuits.

The above-mentioned prior art has some drawbacks. In the layout design of each cell, there are power strips pw1 and pw2. The original intention of using these power strips is to relieve the designer from designing a special power layout, since power strips easily connect with each other to form a power layout of the whole integrated circuit. However, this kind of power strip layout design occupies a great amount of area and increases height of each cell. In other words, distance between layouts of two power strips of FIG. 1 cannot be reduced. With un-reducible cell height, the area of each cell also become un-reducible, hence, the integration of semiconductor integrated circuit cannot be increased efficiently.

SUMMARY OF INVENTION

An objective of the claimed invention is to provide a better method for realizing (including designing) circuit layout. Without using power strips in each cell, the height and area of each cell is reduced, and integration of semiconductor integrated circuit is therefore increased.

In the claimed invention, grid power contacts/vias are utilized to replace power strips of the prior art. When designing integral layout of an integrated circuit, designers select needed cells, arrange the selected cells in the integral layout of the integrated circuit, and connect grid power contacts/vias of each cell in a routing procedure. In other words, power strips are not included in the cells of the claimed invention. Grid power contacts/vias of arranged cells do not connect with each other before the routing procedure; only after the routing procedure, grid power contacts/vias of arranged cells are then interconnected.

Since cells of the claimed invention avoid the use of power strips, height and area of each cell is effectively reduced, and integration of semiconductor integrated circuit is therefore increased. Besides, in the contemporary semiconductor industry, the routing procedure has already become a highly automatic procedure. Even though interconnections between power layouts of the cells are realized through the routing procedure, complexity of the routing procedure is not increased. Unlike the prior art, which has restrictions on power strips of the cells, layout designing between cells of the claimed invention is more flexible.

Based on the currently applied manufacturing process, the claimed invention allows height of each cell to be diminished. Take the 0.13 μm process as an example, in which a pitch equals to 0.28 μm. A cell with cell height of 10 pitches in the prior art is replaced by a cell with cell height of 8 pitches in the claimed invention. Since height of each cell is reduced, integration of designed/manufactured integrated circuits is increased, and area of each integrated circuit is used more efficiently.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
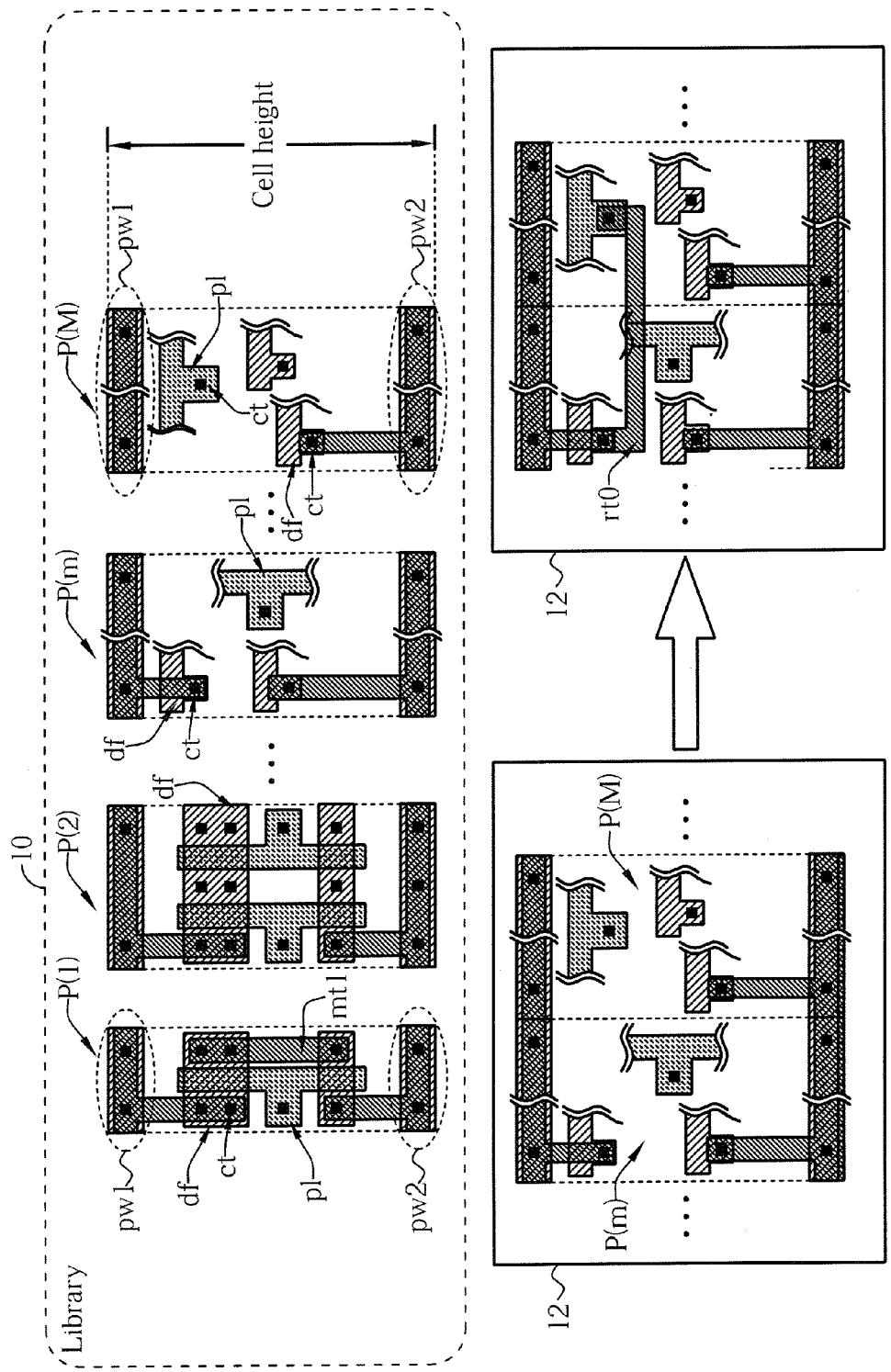
FIG. 1 is a diagram illustrating how the prior art utilizes cells of a library to realize an integrated circuit.
Figure 2:
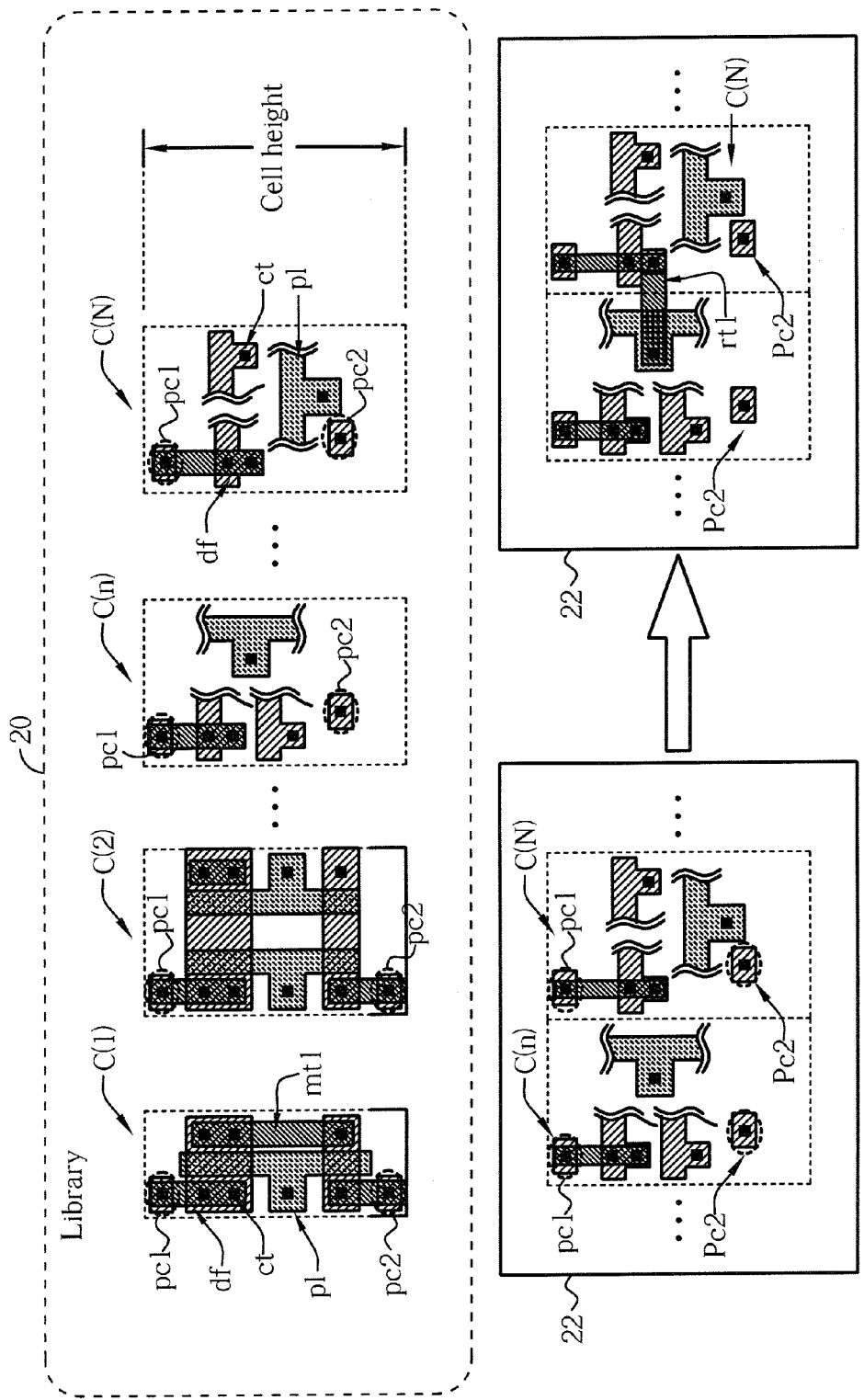
FIG. 2 is a diagram illustrating how the present invention utilizes cells of a library to realize an integrated circuit.

FIG. 2 is a diagram illustrating how cells of the present invention are utilized to realize (including design and manufacture) a semiconductor integrated circuit. In a library 20 of the present invention, layout designs of a plurality of cells C(1), C(2), . . . ,C(n), . . . ,C(N) are recorded. Each cell can be used as a basic block for assembling an integrated circuit. For example, each cell can be a logic gate, a flip-flop, an adder, or a counter, etc. Layout design of each cell at least includes, but not limited to, active region layout(s) df (such as doping well(s) or diffusion region(s)), polycrystalline silicon layout(s) pi, contact/via layout(s) ct, first metal layer layout mt1, and second metal layer layout mt2. With active region/polycrystalline silicon layout(s), basic semiconductor structure of transistors is formed. With contact/via layout(s) ct, layouts on different semiconductor layers are interconnected; for example, transistors are connected with the metal layers. Routings on the metal layers mt1 interconnect transistors of each cells, therefore functions of each cells are combined altogether. Furthermore, certain contacts/vias of each cell are used as signal input/output ends of the cell, i.e. they form signal layout design of the cell.

An idea of the present invention is to use contact/via grids as power layout designs for receiving operation power, instead of using the power strips of the prior art as power layout designs. As is shown in FIG.2, in each cell of the present invention, contact/via layouts are used to realize power layouts pc1 and pc2. Each cell is connected to DC bias power, such as a DC power supply voltage Vdd or ground voltage Vss, through the power layouts pc1 or pc2. In this way, power strips crossing two opposite side of each cell are left out. As shown in FIG. 2, there is no conventional power strip placed at any side of each cell. Hence, height and area of each cell are reduced.

As is shown in FIG. 2, for realizing the layout design of an integrated circuit 22, designers first determine which cells are going to be used according to the required functions of the integrated circuit 22. Next, the cells selected from the library 20 are arranged in a layout design of the integrated circuit 22. Since each cell of the present invention does not include power strips, power layouts (i.e. power grids) pc1 and pc2 of each pair of adjacent cells (For example cell C(n) and cell C(N)) are not interconnected. In a following routing procedure, on one hand, signal layouts (i.e. signal contacts/vias) of each cell are interconnected. On the other hand, power grid layouts of each cell are also interconnected through the routing procedure. Therefore, not only functions of each cell are combined in the integrated circuit 22, power layouts of each cells are also interconnected. As the example of FIG. 2 illustrates, in the routing procedure a routing layout rt1 is used to interconnect signal contacts/vias of the cell C(n) and the cell C(N).

In other words, in the present invention, power grids of each cell are treated as a kind of signal contact/via. Dispersive power layouts are interconnected in the routing procedure to complete the whole power layout of the integrated circuit. In the contemporary semiconductor industry, the routing procedure can be easily accomplished by using some electronic design automation (abbreviated as EDA) tools, in a highly automatic manner. Hence, the idea of the present invention does not complicate the routing procedure. In actuality, with the idea of the present invention, by forming interconnections between power layouts of each cell in the routing procedure, area and height of each cell are reduced. In addition, since the present invention does not have restrictions on power strips of each cell, as does the prior art, circuit layout design becomes more flexible. More specifically, in the prior art, power strips of each cell are arranged in the first metal layer mt1. However, in the present invention, the second metal layer mt2 is used to realize connection between power layouts of each cell and connection between signal layouts of each cell. Certainly, different metal layers can also be used to realize connection between power layouts of each cell and connection between signal layouts of each cell respectively.

Figure 3:
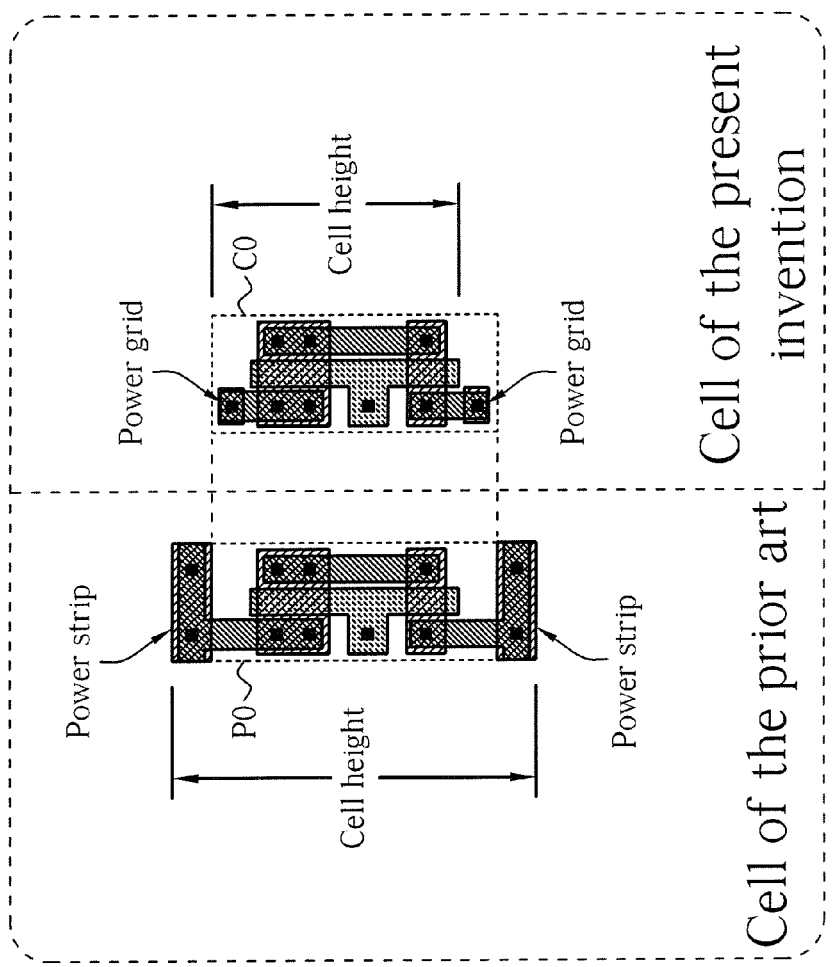
FIG. 3 is a diagram comparing cell height of the present invention with that of the prior art.

Please refer to FIG. 3 for more details. In FIG. 3, a cell C0 of the present invention and a cell P0 of the prior art are compared. Since power grids are used in the present invention to replace power strips of the prior art, the used power grids are just embraced by each cell. Height and area occupied by power strips are hence excluded. Thus, in the present invention, height and area of each cell are efficiently diminished; therefore, integration of the semiconductor integrated circuit is increased. Please refer to the following specific example, as is shown in FIG. 3, cell height of the present invention includes pitches of the first metal layer in NMOS/PMOS active area, and spacing of the first metal layer. In other words, cell height of the present invention would be 8 pitches. Comparatively, except from the above-mentioned basic height, heights of power strips must also be included in the prior art. Hence, the total cell height of the prior art would be 10 pitches. In this example, cell height is reduced from 10 pitches of the prior art to 8 pitches of the present invention. The integration of semiconductor integrated circuits of the present invention is therefore upgraded.

In conclusion, the present invention sets power grids in circuit cells to replace power strips of the prior art. Power layouts are interconnected during the routing procedure. Hence, in contrast to the prior art, the present invention diminishes height and area of each cell. Integration of integrated circuits is therefore increased, and layout area of integrated circuits is used more efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for realizing circuit layout, the method comprising:

for each cell in a library, making a power layout design of the cell not traverse along at least one side of the cell to thereby define a layout design of the cell, wherein the power layout design of the cell is for allowing the cell to receive operation power; and storing a plurality of layout designs of a plurality of cells to establish the library.

2. The method of claim 1, wherein each cell's power layout allows the cell to receive DC bias voltage.

3. The method of claim 1, further comprising:

when designing layout of an integrated circuit, selecting at least one cell's layout design from the library, and arranging the selected cell's layout design in the integrated circuit's layout design; and performing a routing procedure for routing wirings on a metal layer to interconnect power layouts of the integrated circuit's layout design.

4. The method of claim 3, wherein each cell further comprises at least one signal layout design for allowing signal to be inputted to or outputted from the cell, and the method further comprises:

when performing the routing procedure, routing other wirings on the metal layer to interconnect signal layouts of different cells.

5. The method of claim 3, wherein each cell further comprises at least one signal layout design for allowing signal to be inputted to or outputted from the cell, and the method further comprises:

when performing the routing procedure, routing other wirings on another metal layer to interconnect signal layouts of different cells.

6. The method of claim 1, wherein the step of making power layout design of the cell not traverse along at least one side of the cell comprises:

making the power layout design of the cell not traverse along any side of the cell.

7. A method for realizing circuit layout, the method comprising:

for each cell in a library, making a power layout design of the cell not connected to a power layout design of another cell if both are arranged to be adjacent to each other to thereby design a layout design of the cell, wherein the power layout design of the cell is for allowing the cell to receive operation power; and storing a plurality of layout designs of a plurality of cells to establish the library.

8. The method of claim 7, wherein each cell's power layout allows the cell to receive DC bias voltage.

9. The method of claim 7, further comprising:

when designing layout of an integrated circuit, selecting at least one cell's layout design from the library, and arranging the selected cell's layout design in the integrated circuit's layout design; and performing a routing procedure for routing wirings on a metal layer to interconnect power layouts of the integrated circuit's layout design.

10. The method of claim 9, wherein each cell further comprises at least one signal layout design for allowing signal to be inputted to or outputted from the cell, and the method further comprises:

when performing the routing procedure, routing other wirings on the metal layer to interconnect signal layouts of different cells.

11. The method of claim 9, wherein each cell further comprises at least one signal layout design for allowing signal to be inputted to or outputted from the cell, and the method further comprises:

when performing the routing procedure, routing other wirings on another metal layer to interconnect signal layouts of different cells.

12. The method of claim 7, wherein the step of making the power layout design of the cell not connected to the power layout design of another cell if both are arranged to be adjacent to each other comprises:

making the power layout design of the cell not connected to the power layout design of another cell at any side of the cell if both are arranged to be adjacent to each other.

* * * * *